(12) United States Patent
Yoshida et al.

(10) Patent No.: US 7,211,804 B2
(45) Date of Patent: May 1, 2007

(54) CHROMATIC ABERRATION CORRECTOR FOR CHARGED PARTICLES AND CHARGED-PARTICLE OPTICAL APPARATUS USING THE CORRECTOR

(75) Inventors: Takaho Yoshida, Higashimatsuyama (JP); Takeshi Kawasaki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 62 days.

(21) Appl. No.: 10/990,498

(22) Filed: Nov. 18, 2004

(65) Prior Publication Data

US 2005/0104006 A1    May 19, 2005

(30) Foreign Application Priority Data

Nov. 18, 2003  (JP) .............................. 2003-387360

(51) Int. Cl.
  *G21K 1/08*  (2006.01)
  *G21K 7/00*  (2006.01)
(52) U.S. Cl. .................. 250/396 R; 250/310
(58) Field of Classification Search ............... 359/634; 250/396 R, 310
See application file for complete search history.

(56) References Cited

U.S. PATENT DOCUMENTS

| 4,963,748 A * | 10/1990 | Szilagyi ................. 250/396 R |
| 6,924,488 B2 * | 8/2005 | Matsuya et al. ........ 250/396 R |
| 6,982,427 B2 * | 1/2006 | Kawasaki et al. ...... 250/396 R |

OTHER PUBLICATIONS

Zach, J., et al. "*Aberration Correction in a Low Voltage SEM by a Multipole Corrector,*" Nucl. Inst. and Methods in Phys., Res., A vol. 363 (1995), p. 316-325.

* cited by examiner

*Primary Examiner*—Ricky Mack
*Assistant Examiner*—Jack Dinh
(74) *Attorney, Agent, or Firm*—Antonelli, Terry, Stout & Kraus, LLP.

(57) ABSTRACT

The present invention provides an aberration corrector functioning under a condition outside the setting optical condition of an incorporated charged particle beam apparatus.

An intermediate potential region different from the ground potential of an aberration corrector is provided in the space between the stages of multipole lenses constructing the aberration corrector to adjust a potential. Using this, when selecting an incident (outgoing) condition, an outgoing (incident) condition can be adjusted.

13 Claims, 7 Drawing Sheets

CHROMATIC ABERRATION CORRECTOR FOR CHARGED PARTICLES AND CHARGED-PARTICLE OPTICAL APPARATUS USING THE CORRECTOR

CLAIM OF PRIORITY

The present invention claims priority from Japanese application JP 2003-387360 field on Nov. 18, 2003, the content of which is hereby incorporated by reference on to this application.

BACKGROUND OF THE INVENTION

The present invention relates to a technique for minimizing the beam spot diameter of a charged particle beam apparatus. More specifically, the present invention relates to an aberration corrector with lenses in multiple stages including multipole lenses, which is used in a charged particle beam microscope apparatus including a scanning electron microscope.

In a charged-particle optical apparatus including electron microscopes such as a scanning electron microscope (SEM) and a transmission electron microscope (TEM), a lens using an electric field or a magnetic field to condense a charged particle beam is essential. In a rotational symmetrical lens generally used as the electromagnetic lens, chromatic aberration and aperture aberration such as spherical aberration inevitably occurs to define substantial resolution limit. Means preventing or correcting occurring aberration has been desired for a long time for making the resolution of the charged particle optical apparatus higher. An aberration corrector using a non-rotational symmetrical electromagnetic lens is one of radical and strong solving methods therefor. For instance, J. Zach, and M. Haider, Nucl. Inst. and Methods in Phys. Res. A vol. 363 (1995), p316–325 (Document 1) discloses an aberration corrector for SEM of a system having 12 poles in four stages.

FIG. 2 schematically shows the operating principle of the aberration corrector for SEM disclosed in Document 1. A corrector 1 has 12-pole lenses 2, 3, 4 and 5 in four stages. The 12-pole lenses 2 and 5 can form electro-static fields and the 12-pole lenses 3 and 4 can superimpose electro-static and magnetic fields, thereby generating a quadrupole field. Since each of the first to fourth stages has 12 poles, not only the quadrupole field but also a dipole/quadruple/hexapole/octapole field can be generated. The numeral 9 denotes an optical axis, that is, a charged particle trajectory incident upon the center axis of the corrector 1 at an angle of 0□,□ which is matched with the center axis of the corrector.

The quadrupole fields for an electric field and a magnetic field are expressed by the forms (1) and (2), respectively.

$$\phi_2 = \frac{E_2(z)}{2}(x^2 - y^2) \quad (1)$$

$$\psi_2 = B_2(z)xy \quad (2)$$

Using z dependence portions of (1) and (2), the strength of the quadrupole field is defined by (3)

$$\beta(z) = \sqrt{\frac{E_2(z)}{\Phi_0} + \sqrt{\frac{e}{2m}B_2(z)}} \quad (3)$$

to be indicated by the numeral 10. An axial potential about the optical axis 9 is indicated by the numeral 11.

The basic principle of aberration correction is in the use of a one-dimensional concave lens formed by a multipole field.

The correcting principle of the chromatic aberration in the corrector of FIG. 2 is described below. The corrector 1 can realize a one-dimensional convex lens having negative chromatic aberration by combining a one-dimensional concave lens by an electro-static field with a one-dimensional convex lens by a magnetic field in the second and third stages multipoles. The magnitude of the negative chromatic aberration can be arbitrarily adjusted by adjusting the ratio of electric and magnetic field so as to keep β(z) of the equation (3) constant.

To perform chromatic aberration correction using the one-dimensional lens, a charged particle beam passing through the corrector must select specific standard trajectories 7 and 8 satisfying the following trajectory conditions (i) to (iv).

(i) The x trajectory 7 passes through the center of the second-stage multipole lens 3.

(ii) The y trajectory 8 passes through the center of the third-stage multipole lens 4.

(iii) The off-axis distances of the x and y trajectories are equal in the outgoing plane of the fourth-stage multipole lens 5.

(iv) The slopes of the x and y trajectories are equal in the outgoing plane of the fourth-stage multipole lens 5.

A trajectory passing through the center of a lens is not subject to the effect of the lens including aberration. Using the standard trajectories 7 and 8 can isolate the x and y trajectories from each other to add negative suitable chromatic aberration at the second and third stages. As described above, the aberration corrector described in Document 1 suitably adjusts electro-static fields and electromagnetic fields generated by the 12-pole lenses in four stages to satisfy the four trajectory conditions for correcting chromatic aberration.

SUMMARY OF THE INVENTION

The controllable variable parameters for the above-described four conditions (i) to (iv) are only quadruple field strengths $\beta_1$ to $\beta_4$ formed by the multipole lenses in four stages. When an incident condition and an outgoing condition are determined, the $\beta_1$ to $\beta_4$ are uniquely determined as the solution of simultaneous equations expressing the conditional equations (i) to (iv) in the solution existing range, since the number of conditions is equal to the number of parameters. In other words, when either of the incident condition or the outgoing condition is selected to be fixed, the other condition is automatically determined and is not allowed to be arbitrarily selected. Moreover, depending on the incident condition, $\beta_1$ to $\beta_4$ satisfying the trajectory conditions (i) to (iv) are not found in principle, or if they are found, they might be excessive in an applied voltage and magnetic excitation so that aberration correction cannot be realized in reality.

The prior art aberration corrector has been manufactured by preparing a suitable optical system and optimizing shape parameters in addition to the control parameters $\beta_1$ to $\beta_4$ so as to be adapted to the specific optical condition in the design. Here, the shape parameters are specifically size values of the pole thickness (length in z direction) and the distance of the space between the stages of multipoles. The shape parameters cannot be suitably adjusted after completion of the apparatus unlike the control parameters $\beta_1$ to $\beta_4$.

As described above, the number of the variable parameter was limited in the aberration corrector previously proposed. Therefore, it was difficult to adjust the aberration corrector for arbitrary optical conditions such as incident conditions. In some case, an expected aberration correction effect cannot be sufficiently obtained. Operations for changing the incident condition to the aberration corrector will be required, when one want to choose a probe current density or the focusing depth.

Using the shape parameters of the aberration corrector for optimization as described above, is to limit the design of the apparatus. When one design the actual electron microscope, one have to consider not only the conditions for aberration correction, but also constructional conditions such as arrangement of optical apparatuses as lenses, structural strength and assembling accuracy. When the number of limitations in design is increased, it is more difficult to satisfy them at the same time.

There is no independent adjusting means in the aberration corrector, which significantly limits the free degree in use and design.

In the present invention, a focus adjusting function is mounted on the corrector itself so as to execute aberration correction other than the specific optical condition by the aberration corrector of the above-described form.

In order that the aberration corrector has the focus adjusting function, means providing a potential is installed in the space between the multipoles to form an intermediate potential region. The electronic trajectories are bent according to the potential difference inside and outside of the region. When the intermediate potential is flat in the region, the effect of the bending exerts an effect equivalent to adjustment of the distance of the space between the stages. Therefore, the controllable variable parameter added by this invention is equal to the distance of the space between the stages given as one of the invariable shape parameters in the previous section.

When providing such intermediate potential in real, an inhomogeneity of electric field might form an electro-static lens and cause chromatic and aperture aberrations. They are recurrently corrected by the aberration corrector. Therefore, even when the intermediate potential region is substantially an electro-static lens, a desired aberration correcting function can be obtained in principle.

According to the present invention, under the condition other than the optical conditions optimized in the design of the corrector, the focus adjusting function incorporated into the aberration corrector can make re-adjustment so as to be adapted to the aberration correction conditions (i) to (iv) and suitably perform aberration correction. For instance, when changing the crossover position of a condenser lens to choose a probe current in SEM, optimal aberration correction can be always found, since adjustable parameters can be additionally obtained by the present invention. Higher-order optimal aberration correction conditions which have not been obtained only by the free degree in prior art corrector will be also attainable. Examples of the latter, while satisfying the chromatic aberration correction conditions, include setting of a condition for preventing high-order aberration such as second-order chromatic aberration and fifth-order aperture aberration and setting of a condition for stabilizing chromatic aberration correction against power source instability.

The present invention can be realized by the corrector alone by integrating the aberration correction function with the focus adjusting function. The optical adjustment of the corrector can be made independently of other optical elements such as a condenser lens and an objective lens. When adjusting the crossover position of the corrector, the prior art construction must make adjustment in engagement with the condenser lens. The present invention in which the corrector itself has the focus adjusting function can make the above-described adjustment by the corrector alone without touching the condenser lens. The construction of the aberration corrector of this invention also has the merit that the axis alignment accuracy is easily obtained in design and manufacturing.

DETAILED DESCRIPTION OF THE PREFERRED EMBODIMENTS

Embodiment 1

An embodiment will be described below with the drawings.

Figure 1:
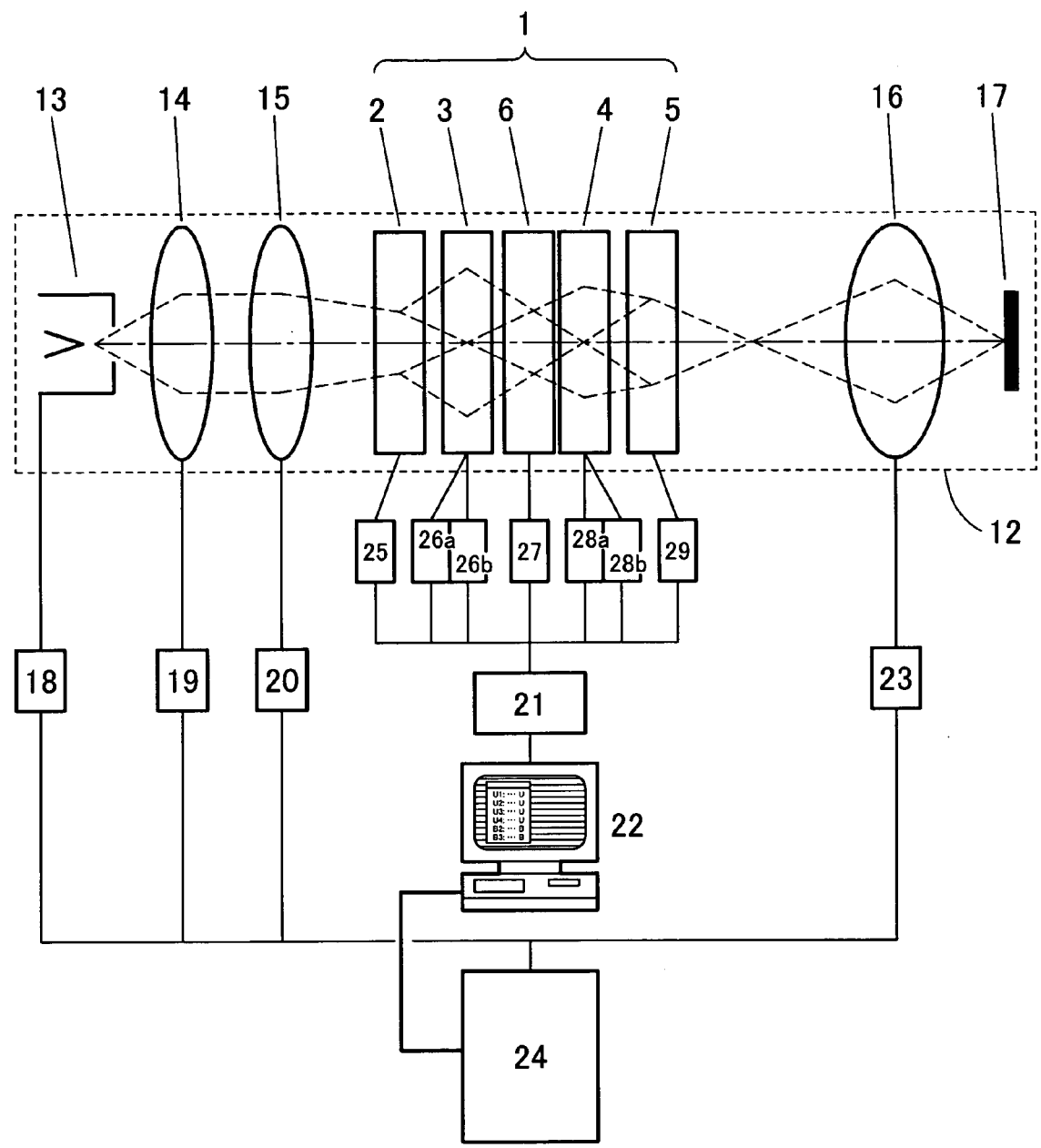
FIG. 1 is a block diagram of a particle optical apparatus (SEM) including an aberration corrector of the present invention.

FIG. 1 shows an embodiment of an SEM. FIG. 1 includes main elements of an electron optics system of the SEM. An electron beam emitted from an electron source 13, after adjustment of the amount of a beam current by condenser lenses 14 and 15, forms a crossover in the position suitable for an objective lens 16. This beam crossover is demagnified and projected onto a sample surface 17 by the objective lens 16 to be a beam probe. The beam probe is scanned on the sample surface by deflector coils, not shown, to produce secondary electrons owing to the electron beam illumination. By measuring the amount of the secondary electrons in positions on the sample surface, "scanning electron microscope image (SEM image)" is thereby obtained. Apparatus and devices which are not important in the description of the present invention, such as a secondary electron detector, a sample stage holding a sample, and aperture apparatus to limit a beam divergence angle, are omitted in FIG. 1.

In the above-described optical system, an aberration corrector 1 is provided between the lower-stage condenser lens 15 and the objective lens 16 to correct aberration of the objective lens 16. The aberration corrector 1 of this embodiment has multipole lenses in multiple stages as a basic construction, that is, it has at least four stages multipole lenses, in which at least quadrupole field can be generated electrostatically in the first and fourth multipoles and electromagnetically in the second and third. The intermediate potential region is formed in at least one space between the stages of the multipole lenses. In the construction of FIG. 1, there are multipole lenses 2, 3, 4 and 5 in the first to fourth stages and an intermediate potential region 6 is formed between the second multipole lens 3 and the third multipole lens 4. The specific construction of multipole lenses 2, 3, 4 and 5 each having 12 poles will be described by the later FIG. 3. To form the intermediate potential region 6, at least a pair of electrodes is provided in the region 6.

The respective devices including the aberration corrector 1 are supported by a housing 12. The housing 12 is also served as a vacuum chamber. Inside of the housing 12 around an electron beam path is kept under vacuum by vacuum pumps accompanied to the apparatus. In principle, the electron source 13 and the sample 17 are arranged in the vacuum. The edges of the electric poles of the multipole lenses 2, 3, 4 and 5 of the aberration corrector 1 must be exposed into this vacuum.

To the multipole lenses 2, 3, 4 and 5 and the electrodes for intermediate potential formation to be functioned, voltage sources 25, 26a, 28a, 29 and 27 and current sources 26b and 26c are prepared. These voltage and current sources are connected to the multipole lenses and the intermediate potential electrodes independently, as shown in FIG. 1. The power sources 25, 26a, 26b, 28a, 28b, 29 and 27 for the multipoles 2, 3, 4 and 5 consist of several power sources corresponding to the symmetry of multipole fields formed by the multipole lenses. To generate a quadrupole field by one 12-pole lens, at least two potentials of $+V_2$ and $-V_2$, that is, two voltage sources are required. To suppress high-order aberration, it is desirable to construct a quadrupole field by four potentials, that is, four voltage sources by adding $+V_2/2$ and $-V_2/2$ thereto.

When superimposing a dipole/hexapole/octapole field for correcting parasitic and high-order aberrations, 12 voltage sources in maximum equal to the number of poles will be necessary corresponding to lowering of symmetry of multipole field. The power sources are arranged outside the housing 12 and are connected to the electric poles in the housing by the method described in FIG. 3 to hold the multipole field symmetry as mentioned above.

In this embodiment, the voltage sources/current sources are controlled via a controller 21 using a computer 22 such as a personal computer. When the operator of a charged particle beam apparatus inputs the optical setting conditions from an input device such as a keyboard attached to the computer 22 as needed, the computer 22 calculates the potential of each electric pole and the magnetic excitation of each magnetic pole based on the above-described standard trajectory setting conditions and aberration correction conditions, and let the voltage sources 25, 26a, 27, 28a and 29 and the current sources 26b and 28b generate electrical voltages and currents determined in the calculation via the controller 21. The control process of them is monitored by the computer 22 to be displayed on an attached display device such as a CRT. The operator views this to check the state of the apparatus.

In the apparatus of the construction of FIG. 1, the electron source 13, the condenser lenses 14 and 15, and the objective lens 16 as optical elements specific for the SEM are connected to power source devices 18, 19, 20 and 23 for driving them. The power sources are controlled by a controller 24 of the SEM. The controller 24 of the SEM is connected to the computer 22 as the controller of the aberration corrector via a network. Both can be engaged with each other to be operated.

Figure 3:
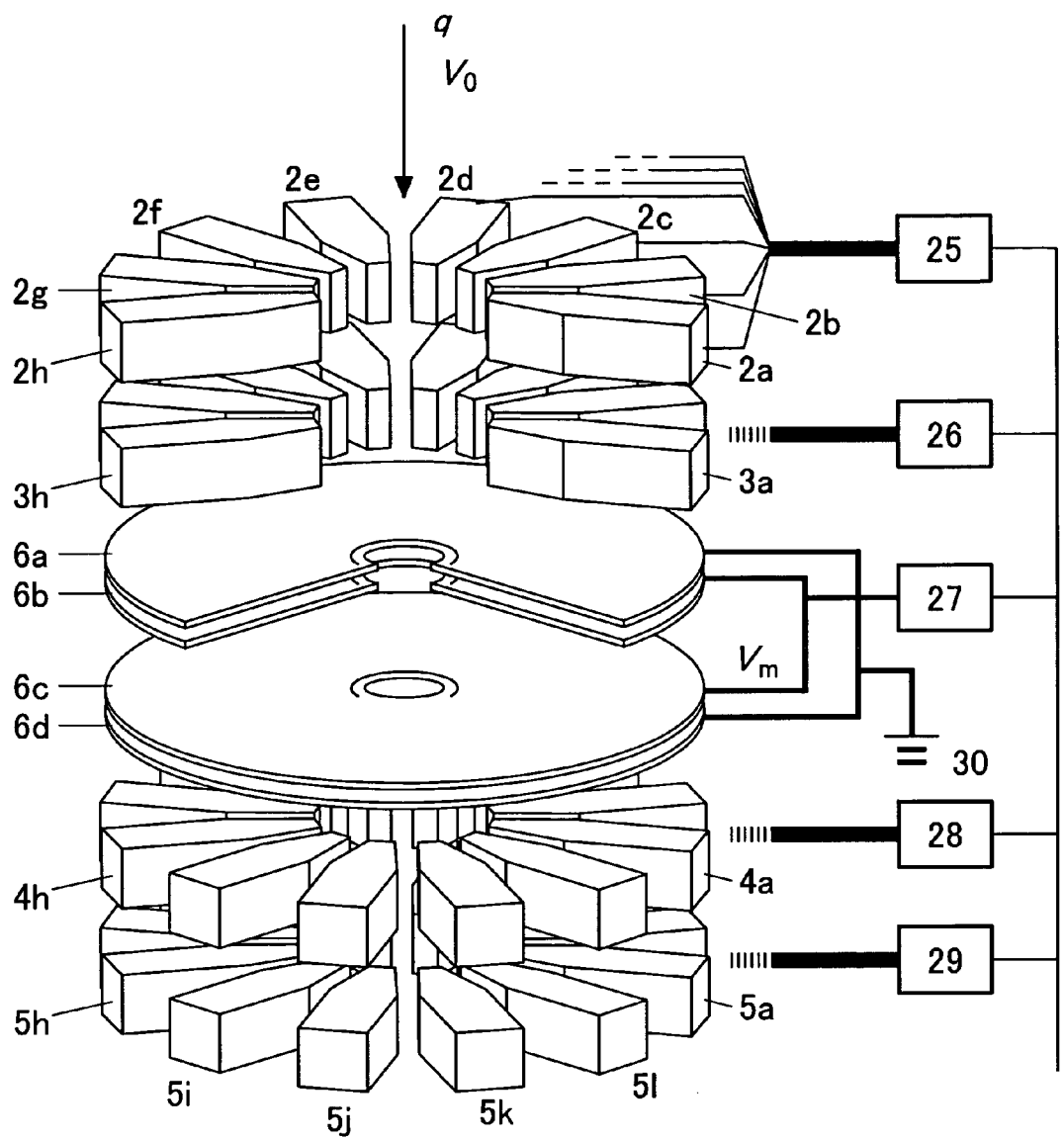
FIG. 3 is a diagram of assistance in explaining one construction of an aberration corrector of the present invention using multipole lenses in four stages.

FIG. 3 is a specific constructional example of the aberration corrector shown in FIG. 1. In FIG. 3, only the electrodes and magnetic poles are shown, while the connection to the external power sources and an electrode holding method are omitted. The multipole lenses in four stages each have 12 poles and can superimpose dipole/quadrupole/hexpole/octapole field by applying the voltages on each poles according to the symmetry of the field to be formed. Here, the term "pole" refers to a single electrode or magnetic pole constructing the multipole lens.

In FIG. 3, only eight poles of the first-stage multipole lens 2 indicated by the numerals 2a to 2h and the second-stage multipole lens 3 indicated by the numerals 3a to 3h are shown. Actually, these stages each has 12 poles will be indicated by the numerals 2a to 2l and 3a to 3l. The poles of the second-stage multipole lens 3 and the third-stage multipole lens 4 serve as both electric and magnetic poles and generate superimposely a electro-static and magnetic quadrupole field which has the same distribution but 45 degrees rotation to each other. The reason why the magnetic quadrupole field is rotated 45 degrees relative to the electric field is that force fields acting on a passing electron beam have to be same shape in the electric field and the magnetic field.

The intermediate potential region is formed in the space between the stages of the second-stage multipole lens 3 and the third-stage multipole lens 4. To form the region, at least a pair of electrodes is provided. In this embodiment, the electrodes consist of four electrodes 6a, 6b, 6c and 6d which have a circular aperture in the center, and are arranged between the second-stage multipole lens 3 and the third-stage multipole lens 4. The outer electrodes 6a and 6d are the shield electrodes grounded on the reference potential of the aberration corrector, and the intermediate potential $V_m$ is applied a to the inner electrodes 6b and 6c. The electric potential between the 6b and 6c is uniform as $V_m$, while rapidly reduced in outside of the 6b and 6c due to the shield electrodes 6a and 6d, that is, a near-rectangle potential can be formed in the region. When providing such potential region, aberrations are localized mainly at the edges of the potential region in which a secondary differential of the potential appears. The potential distribution is forcefully close to a rectangle by the shield electrodes to reduce the substantial length at the edges of the region to prevent aberration by the intermediate potential region from occurring. Even when aberration occurs at the edge of the potential region and can be recurrently corrected by the aberration corrector, the significance of the present invention cannot be damaged.

The 12-pole electrodes (2a to 5l) in the first to fourth stages and the intermediate potential electrodes (6a to 6d) are connected to the external voltage sources 25 to 29. Each pole in second and third stages also has a coil as magnetic field generators which are excited by the current sources 26b and 27b, not shown. These power sources are controlled by the controller using the computer 22. All of these power sources are the variable power sources.

Figure 4:
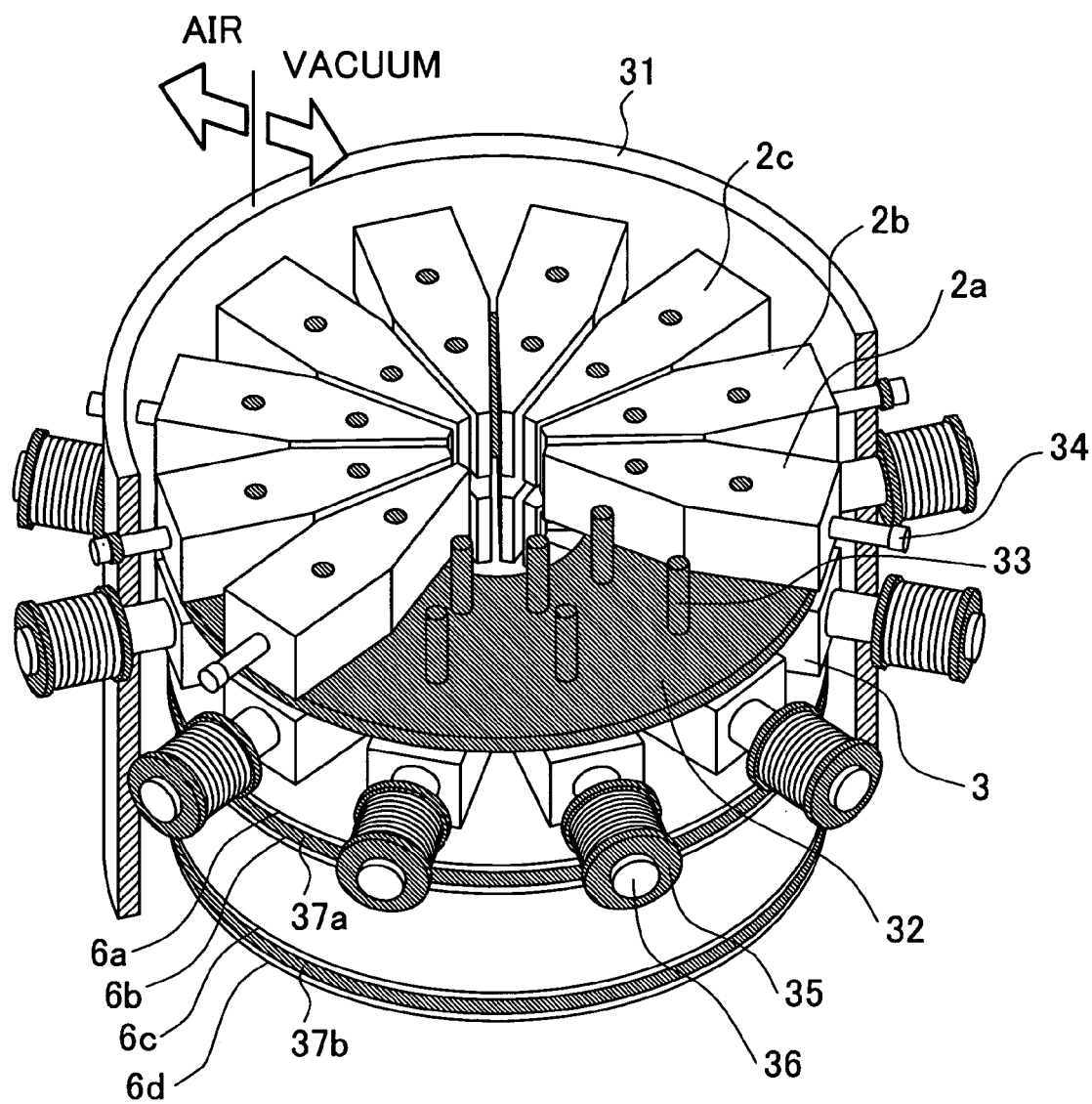
FIG. 4 is a diagram showing a method of assembling an aberration corrector as one embodiment of the present invention.

FIG. 4 shows a more detailed example including electrode holding means and the potential and magnetic excitation introduction means and displays the upper half of the aberration corrector. The 12-pole electrodes 2a, 2b, ... in the first stage and the electromagnetic poles 3a, 3b, ... in the second stage are assembled with reference to a base plate 32 and positioning pins 33 which are precisely installed on the base plate, in order to minimize mutual position shift of electromagnetic poles. The base plate and positioning pins are made of an insulator. The base plate 32 defines the positions of the electric poles in the height direction. The positioning pins 33 define the in-plane positions of the electric poles.

To ensure the parallelism and concentricity between the electrodes, the intermediate potential electrodes 6a to 6d are assembled by interposing flat insulator plates 37a and 37b between the electrodes. The structure having the intermediate potential electrodes 6a to 6d and the flat insulator plates 37a and 37b is rotational symmetric with respect to the center axis.

To make the 12 poles in the upper two stages, the intermediate potential electrodes, and the 12 poles in the lower two stages, not shown, concentric, all parts are stacked to be assembled with reference to a cylindrical housing vacuum case 31. The electrical potentials of the 12 poles 2 are supplied from the outside of vacuum via terminals 34 connected to each poles from the outside of vacuum. Magnetic excitations on 12 poles 3 are generated by the coils 35 outside of vacuum, and transmitted to the poles via terminals 36. The terminals 36 having coils 35, and the magnetic poles are made of a high permeable material such as permalloy to efficiently transmit a magnetic flux to the top of the poles. The terminals 36 serve as the potential introduction in same time, as in the 12-pole terminals in the first stage.

The apparatus housing 31 dose not only supports the electrodes with high accuracy, as described above, but also serves as a vacuum chamber for maintaining them under vacuum. Although not shown, the upper or lower edge of the housing 31 is provided with an opening for vacuum pumping by the external vacuum pump.

Embodiment 2

Figure 5:
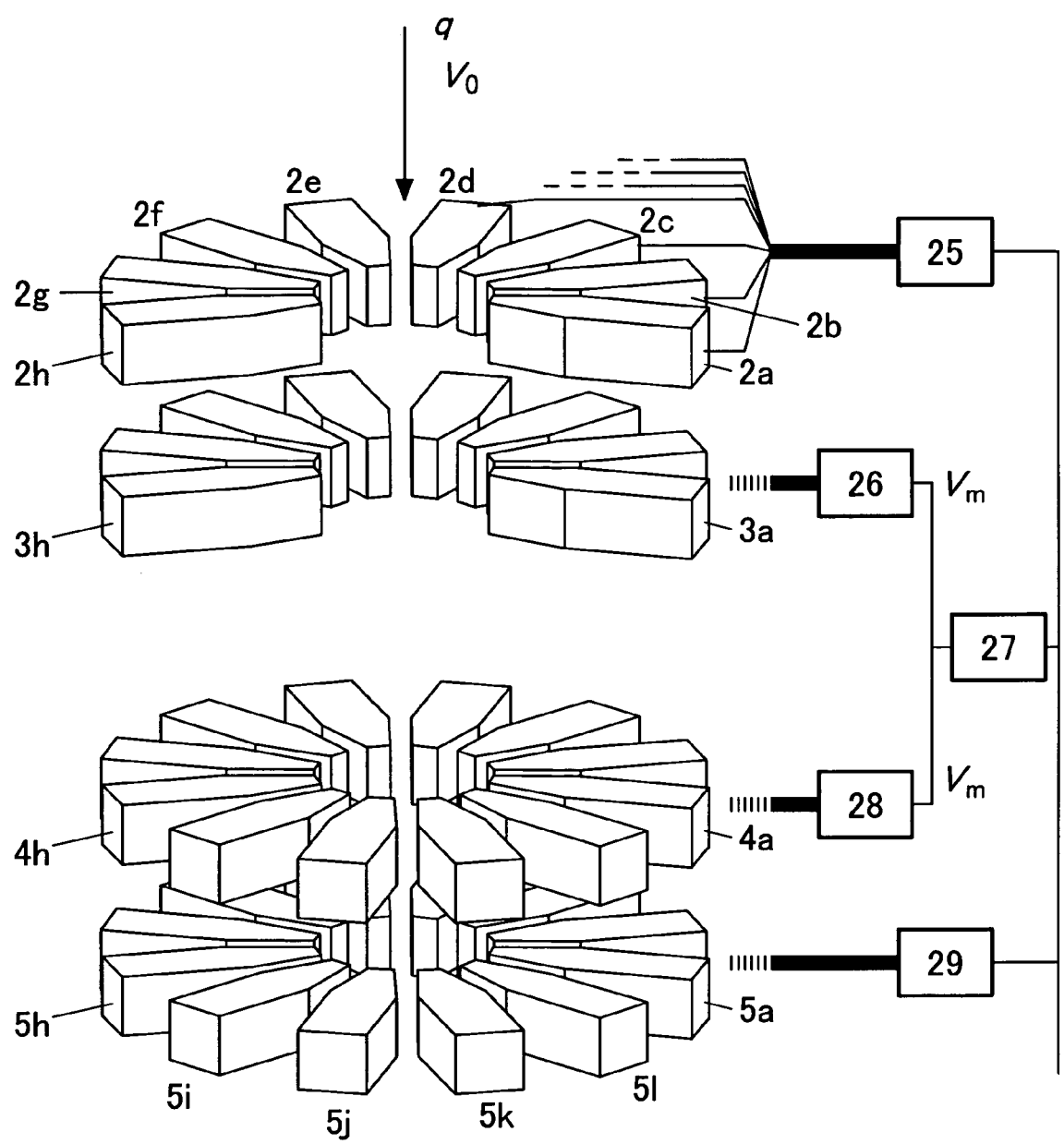
FIG. 5 is a diagram of assistance in explaining the construction of an aberration corrector as another embodiment of the present invention.

FIG. 5 shows a constructional example different from FIG. 3. The 12 poles 3 and 4 in the second and third stages and the intermediate potential electrodes are used together to apply the intermediate potential $V_m$ added to the potential for multipole field formation. The space between the second and third stages of the multipole lenses becomes an intermediate potential region. In FIG. 5, the voltage sources 26, 28, and 27 are connected in series to superimposed intermediate potentials on multipole potentials.

Figure 6:
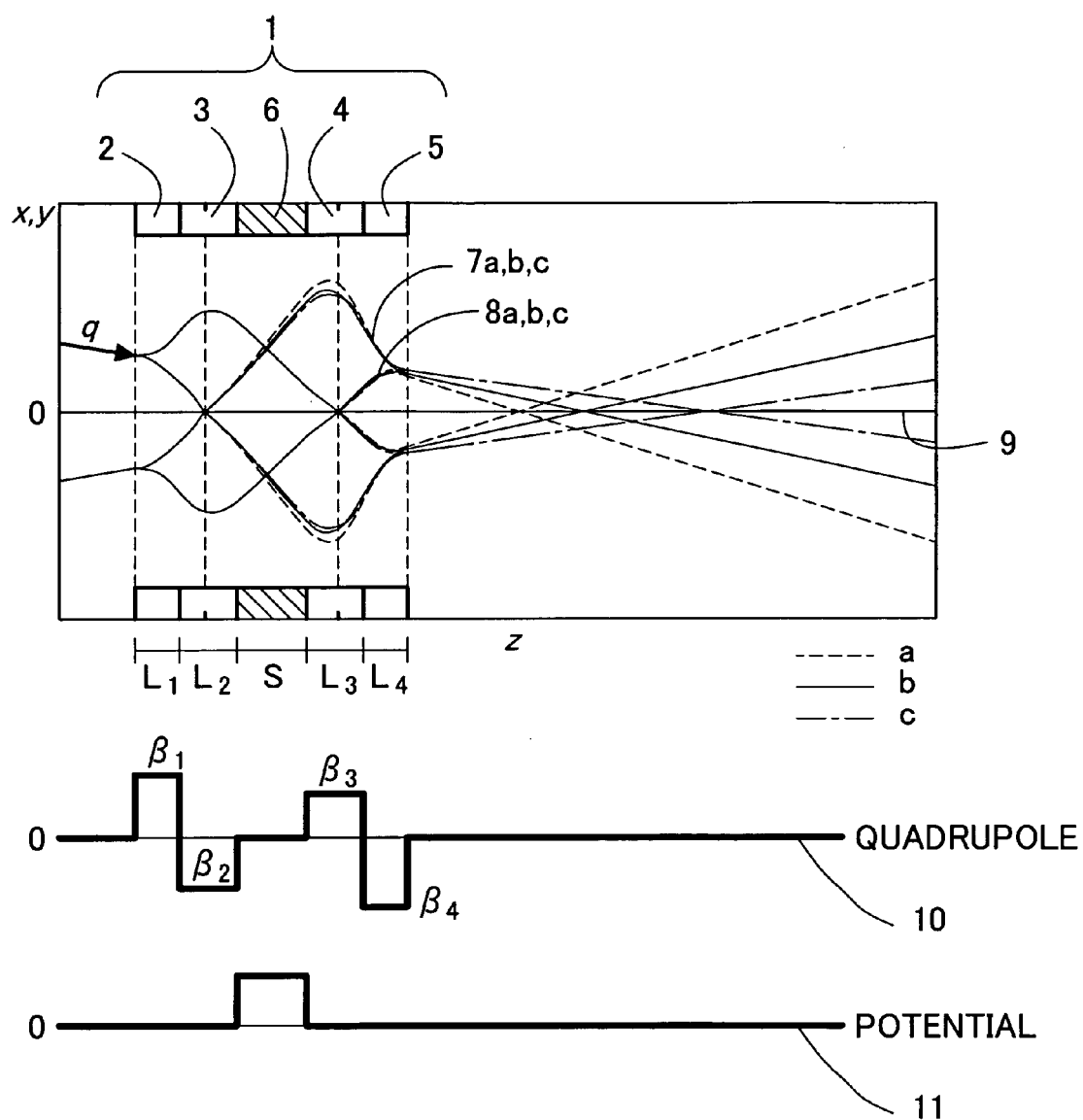
FIG. 6 is a diagram of assistance in explaining the effect of the aberration corrector of the present invention.

FIG. 6 shows results obtained by simulating changes in trajectories in the corrector when the intermediate potential is varied. In the simulation, the incident condition to the corrector is fixed, and rectangle-like distribution of electrical potentials and quadrupole field strengths are assumed. The numerals 7a, 7b and 7c denote an x trajectory and the numerals 8a, 8b and 8c denote a y trajectory. The calculation conditions to a, b and c are summarized in Table 1. A crossover point formed by the aberration corrector moves on an optical axis regardless of fixing the incident condition by increase and decrease of the intermediate potential provided.

Embodiment 3

In Embodiments 1 and 2, the multipole lenses are assembled in four stages and the intermediate potential region is formed between the inner multipole lenses. However, the intermediate potential region may be formed in a space between other stages or in a plurality of spaces between the stages, not between the multipole lenses arranged in the center.

Figure 7:
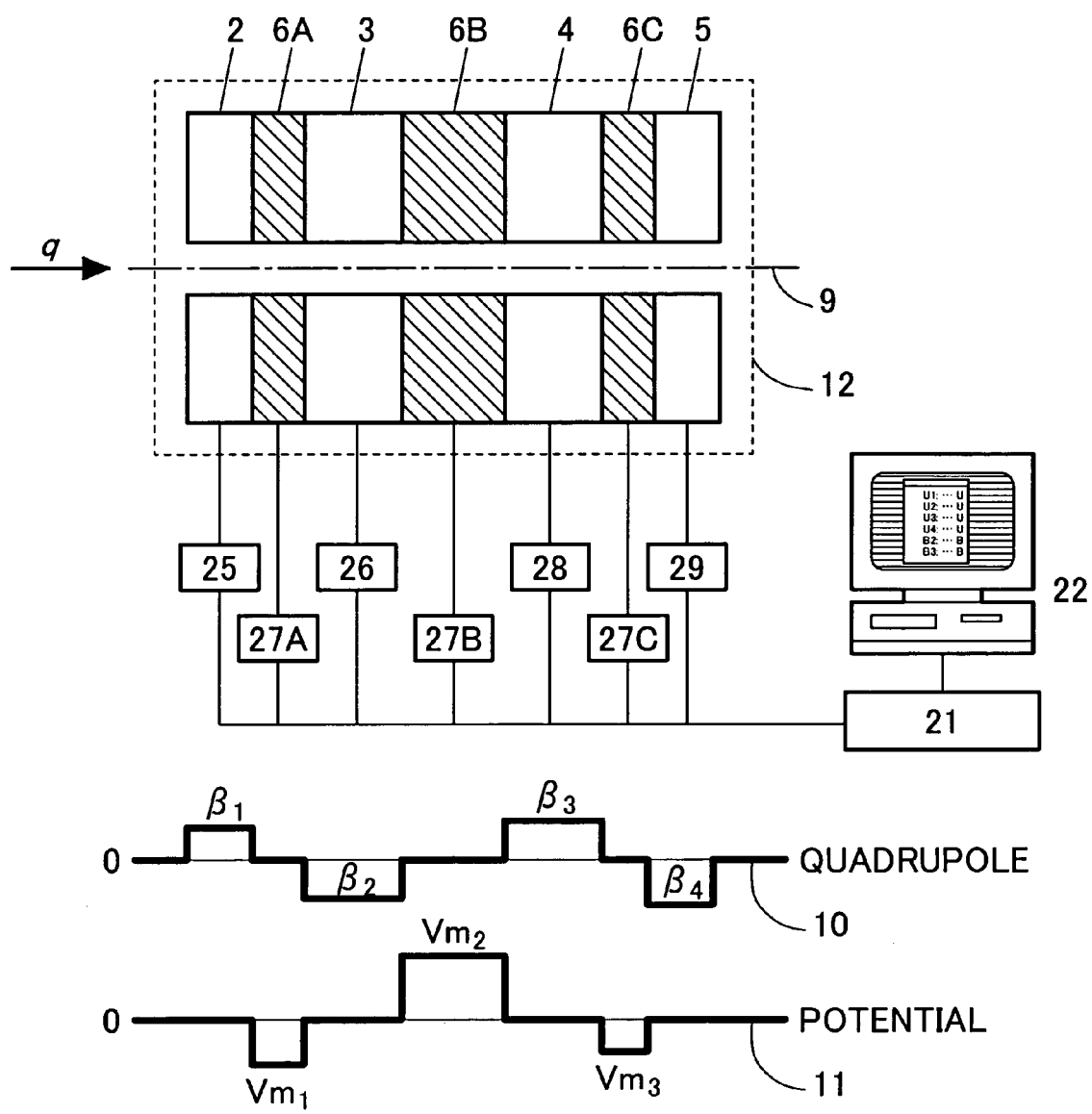
FIG. 7 is a diagram showing another embodiment of the present invention.

In Embodiments 1 and 2, the intermediate potential region 6 is formed only in the space between the stages of the second-stage multipole lens 3 and the third-stage multiple lens 4. In the constructional example shown in FIG. 7, the intermediate potential regions are provided in all three spaces between the stages of the 1-2 (6A), 2-3 (6B), and 3-4 (6C). Such a plurality of intermediate potential regions can be realized by providing the intermediate potential electrode structures 6a, 6b, 6c and 6d of FIG. 3 in the spaces between the stages of the multipole lenses, respectively.

Figure 2:
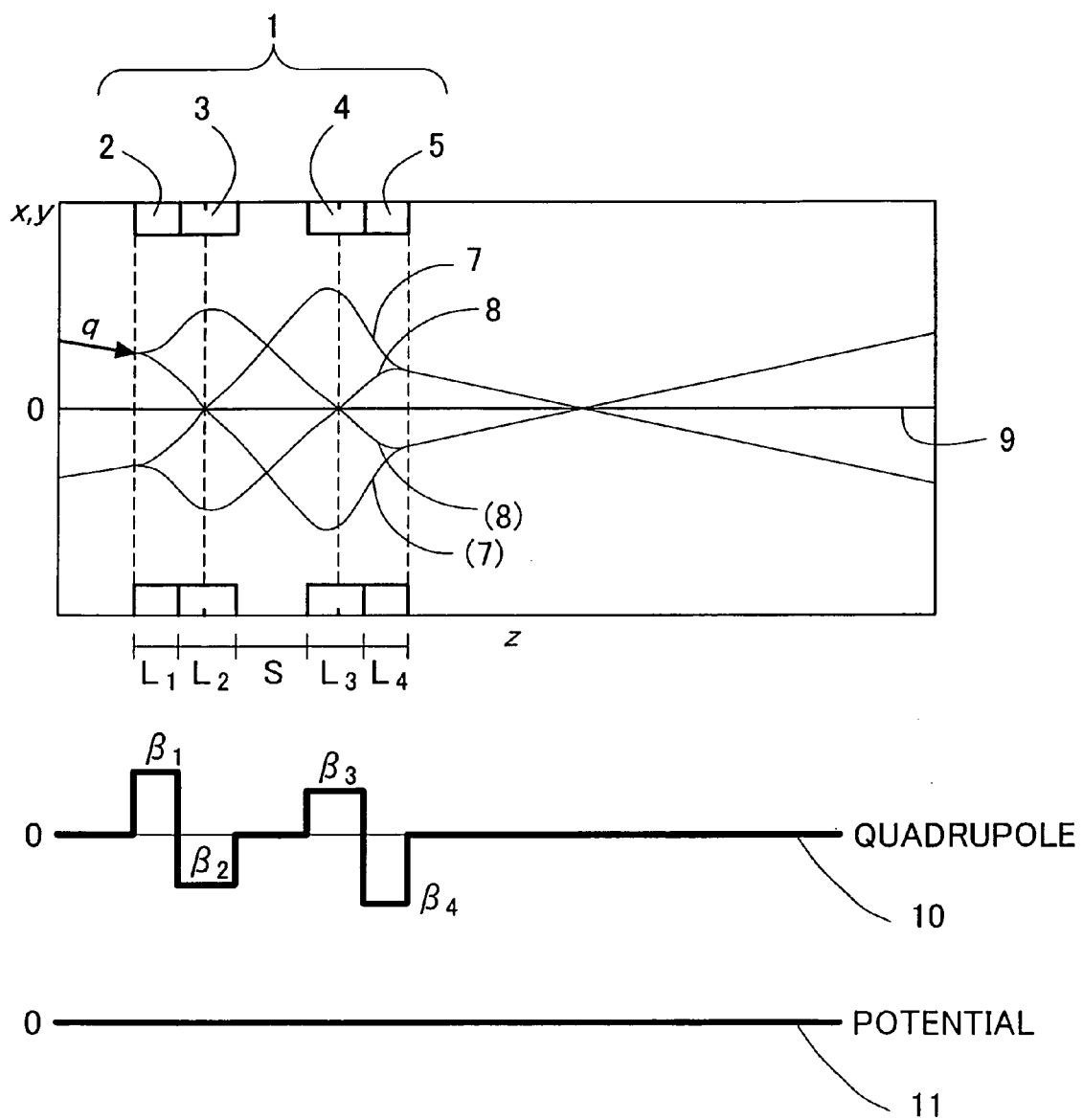
FIG. 2 is a principle explanatory view of prior art aberration correction using multipole lenses in four stages.

The intermediate potentials are supplied from the independent power sources 27A, 27B and 27C. Arbitrary intermediate potentials are provided by the controller 21 and the computer 22. In the drawing, the numeral 10 denotes the quadrupole field strength distribution as that shown in FIG. 2 and the numeral 11 denotes a potential on a center axis. The point in which the computer 22 has the input means and the screen display means and its function are the same as those of the apparatus of the construction described in Embodiment 1.

In this case, the incident condition can be controlled by the intermediate potentials to the 12-pole lenses 3, 4 and 5. When the strengths are unevenly superimposed on one of the multipole lenses in four stages, the intermediate potential is adjusted to re-distribute the quadrupole field strengths to the multipoles in four stages to relax the potential distribution.

What is claimed is:

1. A charged particle beam apparatus comprising:
   a charged particle beam source;
   a sample stage holding a sample illuminated with a charged particle beam;
   a condenser lens condensing the charged particle beam emitted from said charged particle beam source;
   an objective lens illuminating said sample with the charged particle beam which has passed through said condenser lens;
   an aberration corrector arranged between said condenser lens and said objective lens; and
   a vacuum case housing said parts,

TABLE 1

| | | Intermediate potentials | Quadrupole filed strengths ($m^{-1}$) | | | | Crossover positions |
|---|---|---|---|---|---|---|---|
| | | (V) | $\beta_1$ | $\beta_2$ | $\beta_3$ | $\beta_4$ | (z, mm) |
| 7a | (dashed line) | −400 | 92.0 | −76.8 | 87.2 | −119.2 | 95.4 |
| 7b | (solid line) | 0 | 92.1 | −78.1 | 86.4 | −112.2 | 113.7 |
| 7c | (chain line) | +400 | 92.2 | −79.1 | 85.7 | −107.1 | 147.2 |
| | | | Calculation conditions | | | | |
| Electron beam energy | | | | $eV_0 = 2$ keV | | | |
| Virtual source position | | | | $z = 115$ mm | | | |
| Corrector shape | | $L_1$ | $L_2$ | S | $L_3$ | | $L_4$ |
| | | 10 mm | 15 mm | 17 mm | 15 mm | | 10 mm | said aberration corrector comprising:
a plurality of multipole lenses arranged to be opposite each other;
means applying a voltage to said multipole lenses; and
means applying a voltage to the region between said plurality of multipole lenses arranged to be opposite each other.

2. The charged particle beam apparatus according to claim 1,
wherein said aberration corrector comprises:
first power sources having multipole lenses in four stages generating a quadrupole field by an electrostatic field, a magnetic field, or a combination of these by adding a single or arbitrary multipole field and applying voltages forming a multipole field to the poles of said multipole lenses;
magnetic field generators providing magnetic excitation and second power sources driving the same;
a pair of electrodes arranged between a second multipole lens and a third multipole lens; and
a third power source connected to said pair of electrodes.

3. The charged particle beam apparatus according to claim 2, further comprising shield electrodes which are arranged in a region interposed between said second multipole lens and said third multipole lens as the outside of said pair of electrodes.

4. The charged particle beam apparatus according to claim 2, wherein said first, second and third power sources are variable voltage sources.

5. The charged particle beam apparatus according to claim 2, further comprising control means controlling said first, second and third power sources,
said control means capable of controlling a voltage applied to said pair of electrodes.

6. The charged particle beam apparatus according to claim 5, further comprising a computer for controlling said controller, input means for operating said computer, and a display screen,
wherein based on the electron optics condition determined from the request of aberration correction, voltages and magnetic excitations to be distributed to the poles of said multipole lenses are calculated by said computer to control the poles of the multipole lenses via said controller.

7. The charged particle beam apparatus according to claim 2, further comprising a housing holding said aberration corrector.

8. The charged particle beam apparatus according to claim 7, further comprising a construction integrating said first and second multipole lenses or said third and fourth multipole lenses using a base plate holding electric insulation provided between them.

9. The charged particle beam apparatus according to claim 8, wherein said base plate has pins for pole horizontal positioning.

10. The charged particle beam apparatus according to claim 7, wherein said housing has a vacuum pumping port.

11. The charged particle beam apparatus according to claim 7,
wherein said housing has in its outside coils as magnetic field generators for providing magnetic excitation to the poles of said second and third multipole lenses,
wherein said housing has introduction means transmitting a magnetic flux from said coils to the poles in the housing.

12. The charged particle beam apparatus according to claim 1,
wherein said aberration corrector comprises:
first power sources having multipole lenses in four stages generating a quadrupole field by an electrostatic field, a magnetic field, or a combination of these by adding a single or arbitrary multipole field and applying voltages forming a multipole field to poles of said multipole lenses;
magnetic field generators providing magnetic excitation and second power sources driving the same; and
third power sources applying voltages forming a multipole field to the poles of said second and said third multipole lenses added to an offset voltage equal to the poles of said second and third multipole lenses.

13. A charged particle beam apparatus comprising: a charged particle beam source; a sample stage holding a sample illuminated with a charged particle beam; a condenser lens condensing the charged particle beam beamed from said charged particle beam source; an objective lens illuminating said sample with the charged particle beam which has passed through said condenser lens; an aberration corrector arranged between said condenser lens and said objective lens; and a vacuum case housing said parts,
said aberration corrector comprising:
a first multipole lens and a second multipole lens arranged to be opposite each other;
a first power source applying a voltage to said first multipole lens and second multipole lens;
a pair of electrodes arranged between said first multipole lens and second multipole lens; and
a second power source connected to said pair of electrodes.

* * * * *